(12) United States Patent
Perner et al.

(10) Patent No.: US 7,079,436 B2
(45) Date of Patent: Jul. 18, 2006

(54) RESISTIVE CROSS POINT MEMORY

(75) Inventors: Frederick A. Perner, Palo Alto, CA (US); Kenneth Kay Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/675,740

(22) Filed: Sep. 30, 2003

(65) Prior Publication Data
US 2005/0078536 A1 Apr. 14, 2005

(51) Int. Cl.
*G11C 7/02* (2006.01)
(52) U.S. Cl. .................................. 365/209; 365/189.01
(58) Field of Classification Search ................. 365/209, 365/148, 189.01, 189.07
See application file for complete search history.

(56) References Cited

U.S. PATENT DOCUMENTS

| 6,128,239 | A  | * | 10/2000 | Perner ......................... 365/209 |
| 6,188,615 | B1 | * | 2/2001  | Perner et al. ........... 365/189.01 |
| 6,259,644 | B1 |   | 7/2001  | Tran et al. |
| 6,262,625 | B1 |   | 7/2001  | Perner et al. |
| 6,317,375 | B1 |   | 11/2001 | Perner |
| 6,577,529 | B1 | * | 6/2003  | Sharma et al. .............. 365/158 |
| 6,813,208 | B1 | * | 11/2004 | Baker ......................... 365/207 |
| 2004/0004856 | A1 | * | 1/2004 | Sakimura et al. ........... 365/158 |

* cited by examiner

*Primary Examiner*—Thong Q. Le

(57) ABSTRACT

Embodiments of the present invention provide a resistive cross point memory. The resistive cross point memory comprises an array of memory cells and a read circuit. The read circuit is configured to sense a resistance through a memory cell in the array of memory cells to obtain a sense result and calibrate the read circuit based on the sensed result. The read circuit comprises an up/down counter that provides a calibration value to the read circuit.

25 Claims, 8 Drawing Sheets

# RESISTIVE CROSS POINT MEMORY

BACKGROUND OF THE INVENTION

One type of memory known in the art is referred to as a resistive cross point memory (RXPtM). Memory cells in an RXPtM provide resistance values that correspond to logic states, such as logic "0" or logic "1". One exemplary type of RXPtM is a magnetic random access memory (MRAM). An MRAM is a non-volatile memory that includes magnetic memory cells.

A typical magnetic memory cell includes a layer of magnetic film in which the magnetization of the magnetic film is alterable and a layer of magnetic film in which the magnetization is fixed or "pinned" in a particular direction. The magnetic film having alterable magnetization is referred to as a sense layer, and the magnetic film that is pinned, is referred to as a reference layer.

A typical magnetic memory includes an array of magnetic memory cells. Word lines extend along rows of the magnetic memory cells, and bit lines extend along columns of the magnetic memory cells. Each magnetic memory cell is located at an intersection of a word line and a bit line. A magnetic memory cell is written to a logic state by applying magnetic fields that rotate the orientation of magnetization in the sense layer. The logic state of a magnetic memory cell is indicated by the resistance through the memory cell, which depends on the relative orientations of magnetization in the sense layer and reference layer.

A read circuit is used to sense the resistance state of a selected magnetic memory cell to determine the logic state stored in the memory cell. The resistance state can be sensed by applying a voltage to a selected memory cell and measuring a sense current that flows through the memory cell. The resistance is proportional to the sense current.

Sensing the resistance through a memory cell in the array can be unreliable. The memory cells in the array are coupled together through many parallel paths. The resistance at one cross point equals the resistance of the memory cell at that cross point in parallel with the resistances of memory cells in the other word lines and bit lines. Memory cells located along the same word line or bit line typically each see similar resistances.

Read circuits are calibrated to reduce the effect of parasitic resistances. Long read circuit calibration times may interfere with read and write operations in the memory. Hence, it is important for the read circuit to be calibrated and for the calibration times to be relatively short.

SUMMARY OF THE INVENTION

Embodiments of the present invention provide a resistive cross point memory. The resistive cross point memory comprises an array of memory cells and a read circuit. The read circuit is configured to sense a resistance through a memory cell in the array of memory cells to obtain a sense result and calibrate the read circuit based on the sensed result. The read circuit comprises an up/down counter that provides a calibration value to the read circuit.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
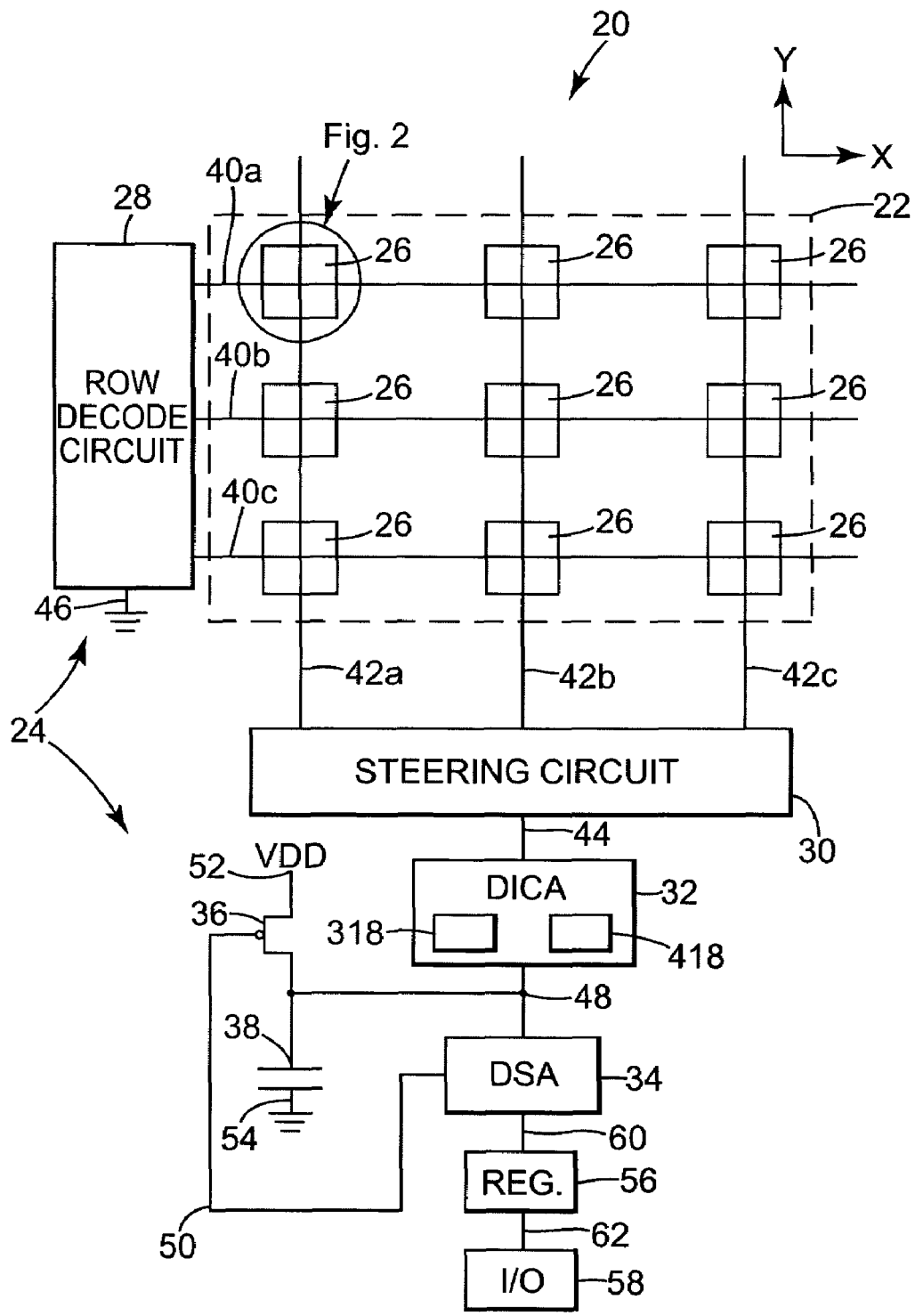
FIG. 1 is a diagram illustrating an exemplary embodiment of a magnetic memory according to the present invention.

FIG. 1 is a diagram illustrating an exemplary embodiment of a magnetic memory 20 according to the present invention. The magnetic memory 20 provides a method and apparatus for calibrating read circuits that improves the reliability of read operations. Magnetic memory 20 includes a magnetic memory array 22, a read circuit 24, and a write circuit (not shown for clarity). The magnetic memory array 22 includes magnetic memory cells 26.

The magnetic memory cells 26 are arranged in rows and columns, with the rows extending along an x-direction and the columns extending along a y-direction. Only a relatively small number of magnetic memory cells 26 are shown to simplify the illustration. In practice, the array 22 can be any suitable size and may utilize highly parallel modes of operation, such as 64-bit wide or 128-bit wide operation.

In the exemplary embodiment, word lines 40a–40c extend along the x-direction in a plane on one side of array 22 and bit lines 42a–42c extend along the y-direction in a plane on an adjacent side of array 22. There is one word line 40a–40c for each row of array 22 and one bit line 42a–42c for each column of array 22. A magnetic memory cell 26 is located at each intersection or cross-point of a word line 40a–40c and a bit line 42a–42c.

The magnetic memory cells 26 are not limited to any particular type of device. Magnetic memory cells 26 may be, for example, spin dependent tunneling junction devices, anisotropic magnetoresistive devices, giant magnetoresistive devices, colossal magnetoresistive devices, extraordinary magnetoresistive devices or very large magnetoresistive devices.

In the exemplary embodiment, the read circuit 24 includes a row decode circuit 28, a steering circuit 30, a direct injection charge amplifier 32, a digital sense amplifier 34, a reset switch 36 and an integrator capacitor 38. The row decode circuit 28 is electrically coupled to word lines 40a–40c, and the steering circuit 30 is electrically coupled to bit lines 42a–42c. The steering circuit 30 is electrically coupled to charge amplifier 32 through charge amplifier output path 44, and the row decode circuit is electrically coupled to ground at 46.

The charge amplifier 32 includes a first up/down counter 318 and a second up/down counter 418. First up/down counter 318 and second up/down counter 418 provide calibration values to calibrate the read circuit. The charge amplifier 32, sense amplifier 34, reset switch 36 and integrator capacitor 38 are electrically coupled together at node 48. In addition, sense amplifier 34 is electrically coupled to the gate of reset switch 36 through switch control path 50. The reset switch 36 is electrically coupled to VDD at 52 and the integrator capacitor 38 is electrically coupled to ground at 54.

The memory device 20 includes an output register 56 and an input/output (I/O) pad 58. An output of the sense amplifier 34 is electrically coupled to the output register 56 through sense amplifier output path 60. The output register 56 is electrically coupled to the I/O pad 58 through output path 62. In the exemplary embodiment, only one read circuit 24, one output register 56 and one I/O pad 58 are shown. In other embodiments, any suitable number of read circuits 24, output registers 56 and I/O pads 58 can be included.

In the exemplary embodiment, the write circuit (not shown) is electrically coupled to word lines 40a–40c and bit lines 42a–42c. The write circuit is configured to provide a first write current through a selected word line 40a–40c in either direction, and a second write current through a selected bit line 42a–42c in either direction.

During a write operation, the write circuit selects one word line 40a–40c and one bit line 42a–42c to set or switch the orientation of magnetization in the sense layer of the memory cell 26 located at the cross-point. The write circuit provides the first write current to the selected word line 40a–40c and the second write current to the selected bit line 42a–42c. The first write current creates a magnetic field around the selected word line 40a–40c, according to the right hand rule, and the second write current creates a magnetic field around the selected bit line 42a–42c, according to the right hand rule. These magnetic fields combine to set or switch the orientation of magnetization in the sense layer of the selected memory cell 26.

The read circuit 24 is configured to sense the resistance through memory cells 26 in array 22 and provide sense results, such as counts, corresponding to the sensed resistance values. In the exemplary embodiment, the row decode circuit 28 includes switches to select one word line 40a–40c and electrically couple the selected word line 40a–40c to ground. The steering circuit 30 includes switches to select one bit line 42a–42c and electrically couple the selected bit line 42a–42c to charge amplifier 32. The charge amplifier 32 provides a constant voltage to the selected bit line 42a–42c. A sense current flows through the selected bit line 42a–42c and the selected memory cell 26 to the selected word line 40a–40c and ground. The sense current, which flows through the selected memory cell 26, corresponds to the resistance through the selected memory cell 26.

The capacitor 38 is charged through reset switch 36 toward supply voltage VDD. The capacitor 38 provides the sense current to the selected memory cell 26 through charge amplifier 32. In the exemplary embodiment, the reset switch 36 is a p-type metal oxide semiconductor (PMOS) transistor. In other embodiments, the reset switch 36 can be combinations of transistors or another type of transistor, such as an n-type metal oxide semiconductor (NMOS).

The digital sense amplifier 34 controls reset switch 36, compares the voltage at node 48 to a reference voltage, provides a sense result and provides an output signal to output register 56. To begin a sense operation, sense amplifier 34 turns on reset switch 36 to charge capacitor 38 toward supply voltage VDD. Sense amplifier 34 opens reset switch 36 and compares the voltage at node 48 to a reference voltage. The voltage at node 48 decreases at a rate that is proportional to the sense current and resistance through selected memory cell 26. The sense amplifier 34 includes a counter that counts until the voltage at node 48 has decreased to the reference voltage. The resulting count corresponds to the resistance of the selected memory cell 26.

In the exemplary embodiment, the direct injection charge amplifier 32 supplies a current to the selected memory cell 26 while maintaining a potential on the non-selected memory cells 26 of the selected bit line 42a–42c. This potential is equal to the potential applied to non-selected rows and columns of the array 22. As the charge amplifier 32 applies a fixed voltage to the selected bit line 42a–42c, a resulting constant sense current is supplied to the selected memory cell 26. The digital sense amplifier 34 measures signal integration time. The signal integration time is partly a function of the resistance of the selected memory cell 26, which is either at a first state R or a second state R+ΔR. The digital sense amplifier 34 can determine the resistance state of the memory cell 26 and, therefore, the logic value stored in the memory cell 26 by comparing the signal integration time to one or more thresholds. An output of the digital sense amplifier 34 is supplied to an output register DOUT which, in turn, is coupled to an I/O pad 58 of the magnetic memory 20.

In the exemplary embodiment, each steering circuit 30 includes a set of switches that connect each bit line 42a–42c to either a constant voltage source or a charge amplifier 32. Each steering circuit 30 selects only one switch for connecting the selected bit line 42a–42c to the charge amplifier 32. All other (unselected) bit lines 42a–42c are connected to the constant voltage source. In one embodiment, the constant voltage source is supplied from an external circuit.

During a read operation, row decode circuit 28 selects a word line 40a–40c and steering circuit 30 selects a bit line 42a–42c. The sense amplifier 34 turns on reset switch 36 to charge capacitor 38 toward VDD. Sense amplifier 34 opens reset switch 36 and provides a clock signal to a counter. Charge amplifier 32 provides a constant voltage across the selected memory cell 26 and a sense current through the selected memory cell 26. The sense current is provided by capacitor 38 through charge amplifier 32 to the selected memory cell 26. Sense amplifier 34 compares the voltage at node 48 to a threshold voltage and stops providing the clock signal to the counter when the voltage at node 48 reaches a threshold voltage. The resulting count is compared to threshold values to obtain the logic state of the selected memory cell and to determine whether the read circuit 24 needs to be calibrated. If the resulting count exceeds the threshold values, a complete calibration, referred to as a large calibration, or a tune-up calibration, referred to as a small calibration, is performed to calibrate the charge amplifier.

A large calibration adjusts the count in first up/down counter 318 and second up/down counter 418. During a large calibration, the first up/down counter 318 is adjusted to change the course calibration of charge amplifier 32 and the second up/down counter 418 is adjusted to change the fine calibration of charge amplifier 32. A small calibration adjusts the count in second up/down counter 418. During a small calibration, the second up/down counter 418 is adjusted to change the fine calibration of charge amplifier 32.

Figure 2:
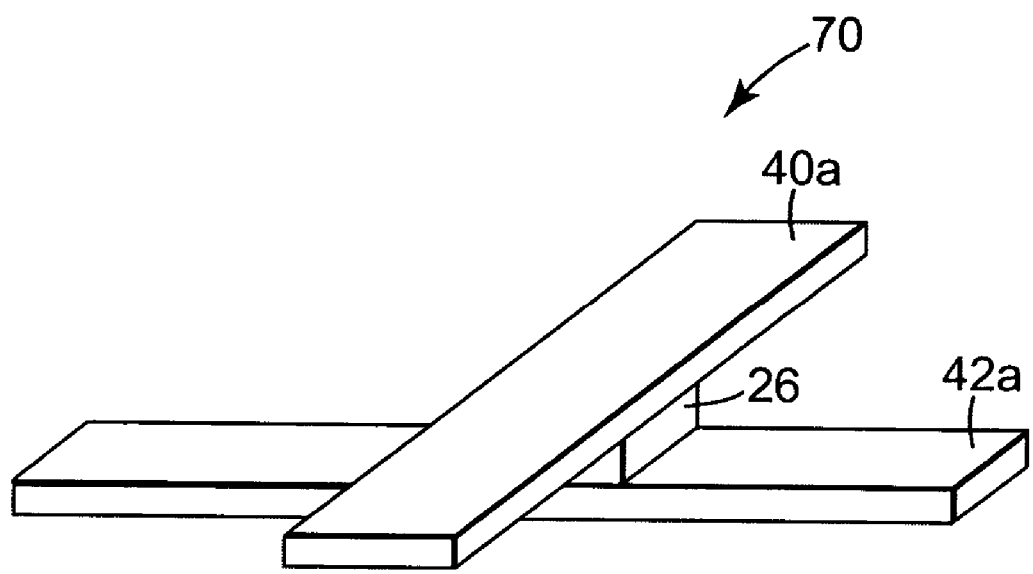
FIG. 2 is a diagram illustrating an exemplary embodiment of an array section.

FIG. 2 is a diagram illustrating an exemplary embodiment of an array section, indicated at 70. Array section 70 includes word line 40a, a memory cell 26 and bit line 42a. Memory cell 26 is located between word line 40a and bit line 42a. In the exemplary embodiment, word line 40a and bit line 42a are orthogonal to one another. In other embodiments, word line 40*a* and bit line 42*a* can lie in other suitable angular relationships to one another.

In the exemplary embodiment, word line 40*a* and bit line 42*a* are electrically coupled to read circuit 24 and the write circuit. The write circuit provides write currents to word line 40*a* and bit line 42*a* to create magnetic fields, according to the right hand rule, around word line 40*a* and bit line 42*a*, and in memory cell 26. The magnetic fields combine to set or switch the state of memory cell 26.

Figure 3:
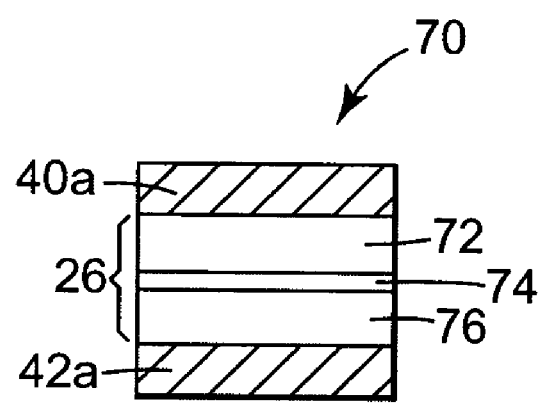
FIG. 3 is a diagram illustrating a cross section of an exemplary embodiment of an array section.

FIG. 3 is a diagram illustrating a cross section of the exemplary embodiment of array section 70. The array section 70 includes memory cell 26 located between word line 40*a* and bit line 42*a*. Memory cell 26 includes a sense layer 72, a spacer layer 74 and a reference layer 76. The spacer layer 74 is located between the sense layer 72 and the reference layer 76. The sense layer 72 is located next to word line 40*a*, and the reference layer 76 is located next to bit line 42*a*. The sense layer 72 has an alterable orientation of magnetization and the reference layer 76 has a pinned orientation of magnetization.

In the exemplary embodiment, memory cell 26 is an MTJ, spin tunneling device with spacer layer 74 being an insulating barrier layer through which an electrical charge tunnels during read operations. Electrical charge tunneling through spacer layer 74 occurs in response to a voltage applied across memory cell 26. In an alternative embodiment, a GMR structure can be used for memory cell 26 with spacer layer 74 being a conductor, such as copper.

Figure 4:
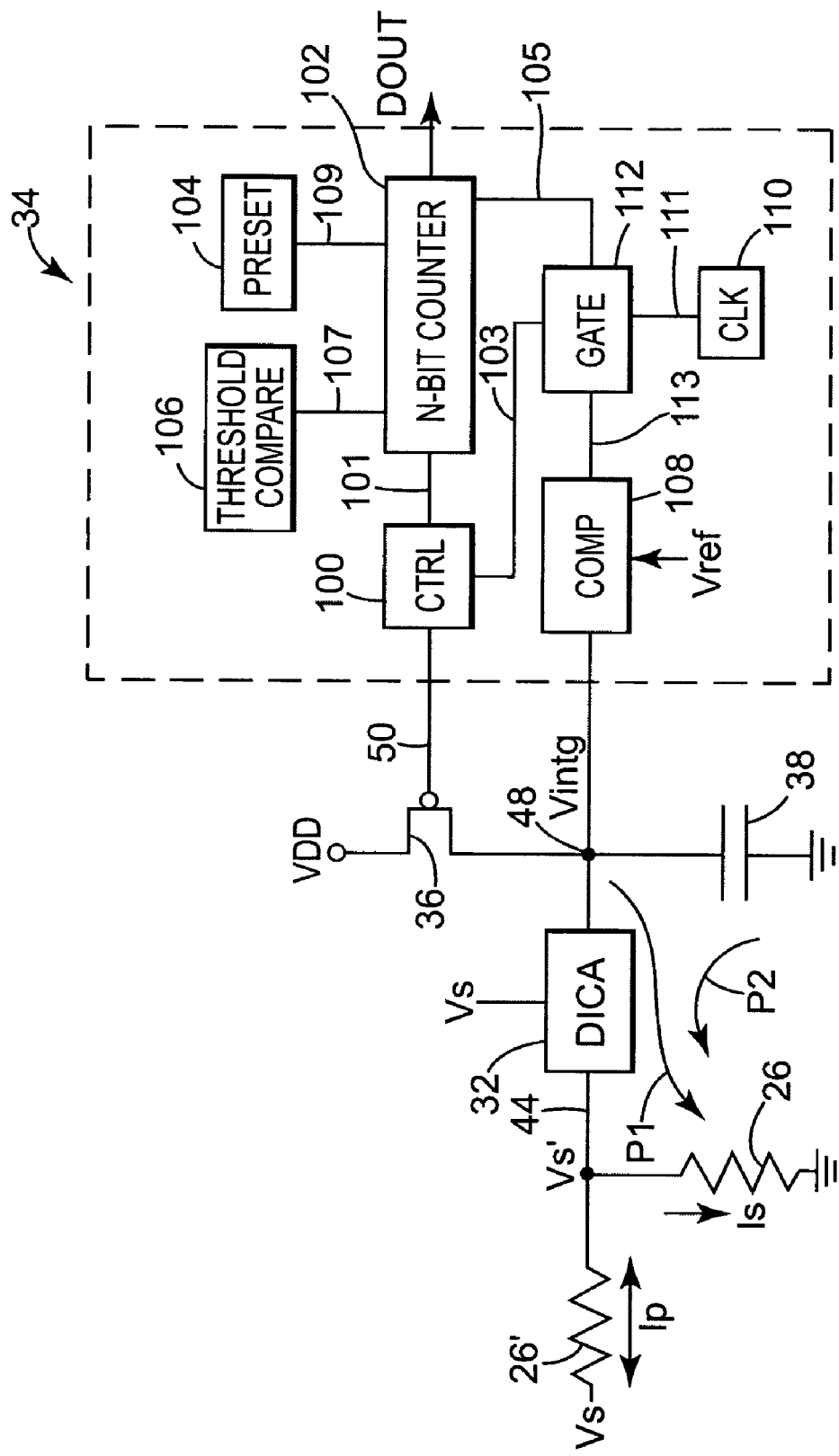
FIG. 4 is a diagram illustrating an exemplary embodiment of a sense amplifier.

FIG. 4 is a diagram illustrating an exemplary embodiment of a sense amplifier 34 during a read operation of a selected memory cell, represented by a resistor at 26. Sense amplifier 34 supplies a control signal through switch control path 50, to switch the reset switch 36 on (conducting) or off (not conducting). As the reset switch 36 is activated, a supply voltage VDD is applied to the integrator capacitor 38. The integrator capacitor 38 is charged as a first current follows a first path P1 through the reset switch 36 and the selected memory cell 26. After the reset switch 36 is turned off, a second current including the sense current Is is supplied from the integrator capacitor 38. The second current follows a second path P2 and includes the sense current Is through the selected memory cell 26 and any parasitic currents Ip from the array 22. The parasitic currents Ip from the array 22 can arise because the sense voltage Vs' applied to the selected memory cell 26 is not precisely equal to the applied array voltage Vs. As long as the integrator voltage Vintg at node 48 is greater than the voltage across the selected memory cell 26, the capacitor 38 functions as a linear integrator.

In the exemplary embodiment, the direct injection charge amplifier 32 controls a sense voltage Vs' across the selected memory cell 26. The sense voltage Vs' is independent of the second current. A constant voltage Vs is applied to the unselected word lines 40*a*–40*c* and bit lines 42*a*–42*c* resulting in an equal potential voltage being applied across the memory cells 26'. The equal potential voltage results in parasitic currents Ip that are substantially less than the sense current Is. Direct injection charge amplifier 32 maintains the voltage Vs' across selected memory cell 26 at a value equal to Vs so the voltage Vs–Vs' across unselected memory cells 26' and therefore the parasitic currents Ip are minimized. The current that flows through the direct injection charge amplifier 32 is directly proportional to the resistance of the selected memory cell 26, without having to make corrections or adjustments for variations in the sense voltage Vs'. The direct injection charge amplifier 32 includes a high gain negative feedback amplifier for controlling the selected bit line voltage Vs' to a set value and for minimizing the variance of the sense voltage Vs' over a wide range of sense currents.

The resistance value of memory cell 26 and the capacitance value of integrator capacitor 38 determine how quickly capacitor 38 is discharged after reset switch 36 is opened. The capacitor 38 discharges more quickly when the memory cell 26 has a resistance of R as compared to when the memory cell 26 has a resistance of R+ΔR.

Sense amplifier 34 includes a sense amplifier controller 100, an N-bit counter 102, a preset register 104, threshold compare logic 106, a comparator 108, a clock 110 and a clock gate 112. The sense amplifier controller 100 is in electrical communication with threshold compare logic 106 and preset register 104, and electrically coupled to N-bit counter 102 through counter bus 101. In addition, sense amplifier controller 100 is electrically coupled to clock gate 112 through gate control path 103, and to the gate of reset switch 36 through switch control path 50. The N-bit counter 102 is electrically coupled to threshold compare logic 106 through threshold compare bus 107, and preset register 104 through preset register bus 109 for transferring count values. In addition, the N-bit counter is electrically coupled to clock gate 112 though gate output path 105 for receiving a gated clock signal. The clock 110 is electrically coupled to clock gate 112 through clock output path 111, and comparator 108 is electrically coupled to clock gate 112 through comparator output path 113 for gating the clock signal.

A drain-source path through reset switch 36 is electrically coupled to VDD and node 48. Node 48 is electrically coupled to the comparator 108 of sense amplifier 34. In addition, node 48 is electrically coupled to direct injection charge amplifier 32 and capacitor 38, which is coupled to ground at 54. The charge amplifier 32 is electrically coupled to memory cell 26 through charge amplifier output path 44 and steering circuit 30 (not shown in FIG. 4).

The sense amplifier 34 measures the integration time to determine the resistance state of the selected memory cell 26 and, therefore, the logic value stored in the selected memory cell 26. The comparator 108 is for comparing the capacitor voltage Vintg to a DC reference voltage Vref. The clock 110 causes the counter 102 to increment a counter value at clock frequency. If the clock 110 is started as the reset switch 36 is turned off, and the clock 110 is stopped as the capacitor voltage Vintg equals the reference voltage Vref, the counter value stored in the counter 102 indicates the amount of time for the voltage Vintg on the integrator capacitor 38 to decay to the reference voltage Vref.

The N-bit preset register 104 can temporarily store the contents of the counter 102 and load the preset register 104 contents into the counter 102. The preset register 104 can also be loaded by controller 100 with specific values such as for initialization or for 2's complement addition. In other embodiments, specific values can be supplied through the I/O pads of magnetic memory 20.

The controller 100 controls the reset switch 36, counter 102, gate 112, preset register 104 and threshold compare logic 106. Under control of the controller 100, the read circuit 24 operates in different modes that include read operations and measurement of calibration values. In other embodiments, different modes can be selected through the I/O pads of magnetic memory 20.

Before a read operation is performed, the negative of a threshold is preloaded into the counter 102. After the read operation, the most significant bit of the counter value represents the logic value stored in the selected memory cell 26. An output DOUT of the most significant bit of the counter 104 is coupled to the register 56.

In another embodiment, before the read operation is performed, the counter 102 is initialized to a value of zero. After the read operation, the magnitude of the counter value is compared to threshold values representing a logic "0" and a logic "1" to determine the logic value stored in the selected memory cell 26. An output DOUT representing the logic value is coupled to the register 56.

A read operation can be performed by performing a single sense operation or by performing multiple sense and write operations. In the exemplary embodiment a read operation is performed to obtain a sense result calibration value. The calibration value corresponds to the counter value stored in counter 102 after a sense operation is performed. The calibration value corresponds to the amount of time for the voltage Vintg on the integrator capacitor 38 to decay to the reference voltage Vref.

The threshold compare logic 106 stores maximum threshold and minimum threshold values. A large error calibration of the read circuit 24 is performed if a calibration value is outside the maximum threshold values. A small error calibration of the read circuit 24 is performed if the calibration value is between maximum and minimum threshold values.

The maximum threshold values include a maximum upper threshold value and a maximum lower threshold value. A large error calibration of the read circuit is performed if the calibration value is greater than the maximum upper threshold value or less than the maximum lower threshold value.

The minimum threshold values include a minimum upper threshold value and a minimum lower threshold value. A small error calibration of the read circuit is performed if the calibration value is equal to or greater than the maximum lower threshold value and less than the minimum lower threshold value, or is greater than the minimum upper threshold value and equal to or less than the maximum upper threshold value.

The large error calibration and the small error calibration optimize or match the performance of the components that are coupled to selected and unselected rows or columns and that can adversely affect read performance of the read circuit 24. In the exemplary embodiment, the large error calibration and the small error calibration correct for unintended current leakage resulting from unselected rows 40a–40c that are coupled to selected columns 42a–42c, where the unselected rows are coupled to unselected components such as memory cells 26 that can provide current leakage paths.

In an exemplary embodiment, the circuit parameters of magnetic memory 20 are sized to accommodate a sense current range of 200 nA to 500 nA, a power supply voltage VDD of 3.3V, a reference voltage Vref of 1.0 volts, a clock 110 having a clock frequency of 100 MHz, and a counter 102 that is 9-bits wide. The minimum DC sense current of 200 nA determines the capacitance C of capacitor 38 for a 2.3V swing (VDD-Vref) in 512 levels, with each clock tick equaling 10 nanoseconds. A sense current Is of 400 nA represents a reference logic "1" and a sense current Is of 350 nA represents a reference logic "0". These sense current values correspond to a counter value (CNT) that is dependent upon the frequency of the clock 110, the voltage swing (VDD-Vref), and the capacitance value of capacitor 38. In the exemplary embodiment, a reference logic "1" corresponds to 255 counter ticks, and a reference logic "0" corresponds to 292 counter ticks. A midpoint counter value corresponds approximately to 273 counter ticks.

The maximum lower threshold value, minimum lower threshold value, minimum upper threshold value and the maximum upper threshold value correspond to counter values stored in threshold compare logic 106. In the exemplary embodiment, minimum threshold values are calculated using approximately 2% of the counter value midpoint between a logic "0" and a logic "1" (e.g. 5 counter ticks), and maximum threshold values are calculated using approximately 10% of the counter value midpoint (e.g. 27 counter ticks).

In one example illustrating the calibration of read circuit 24 while reading a logic "0", the large error calibration of the read circuit 24 is performed if the calibration value is greater than a maximum upper threshold value of 319 counter ticks or less than a maximum lower threshold value of 265 counter ticks. The small error calibration of the read circuit for a logic "0" read is performed if the calibration value is equal to or greater than a maximum lower threshold value of 265 counter ticks and less than a minimum lower threshold value of 287 counter ticks, or is greater than a minimum upper threshold value of 297 counter ticks and equal to or less than a maximum upper threshold value of 319 counter ticks. The large error calibration and the small error calibration are not performed and the read "0" is valid if the calibration value is equal to or greater than 287 counter ticks and equal to or less than 297 counter ticks. In another example, the calibration of read circuit 24 can be performed while reading a logic "1".

In other embodiments, other suitable values for a valid read and for the maximum lower threshold value, the minimum lower threshold value, the minimum upper threshold value and the maximum upper threshold value can be used. Also, in other embodiments, the values for a valid read and for the maximum lower threshold value, the minimum lower threshold value, the minimum upper threshold value and the maximum upper threshold value can be supplied through the I/O pads of magnetic memory 20 to controller 100 and threshold logic 106.

A sense amplifier of the type described herein is disclosed in U.S. Pat. No. 6,188,615 to Perner et al., issued Feb. 13, 2001, entitled "MRAM Device Including Digital Sense Amplifiers," which is incorporated herein by reference.

Figure 5:
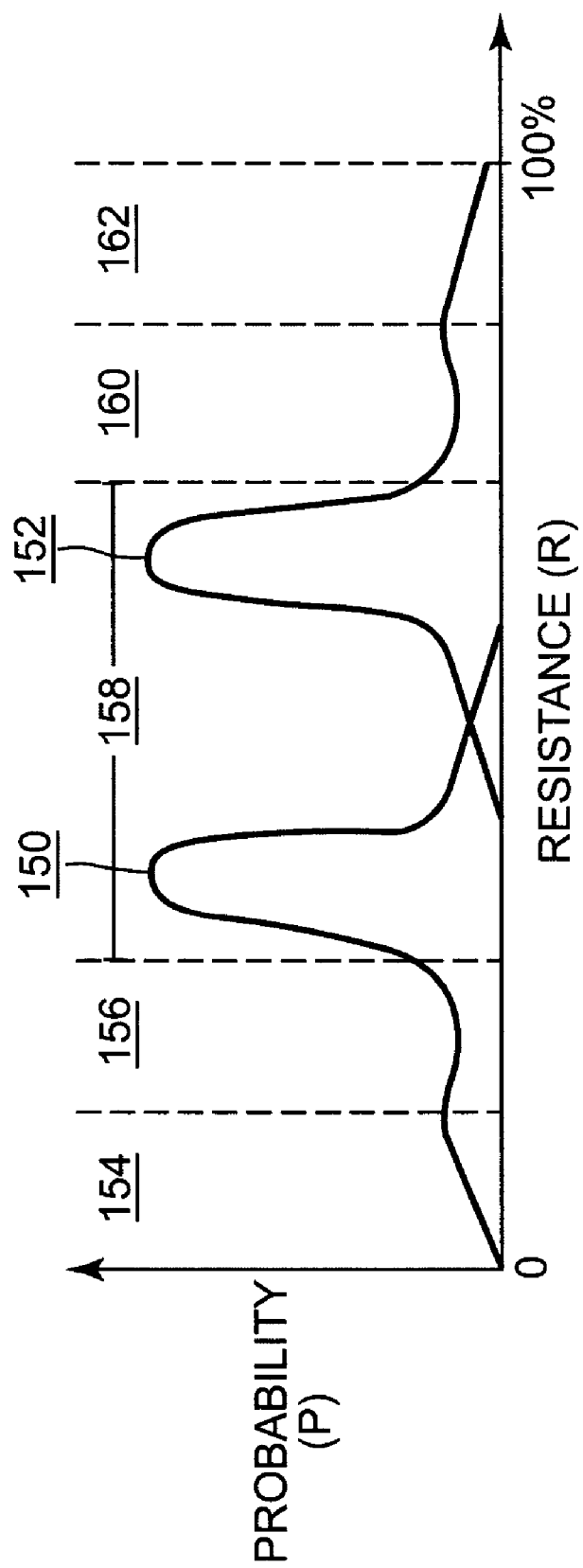
FIG. 5 is a graph illustrating the probability that a memory cell has a certain resistance value and illustrating five categories for a first count.

FIG. 5 is a graph for another embodiment illustrating the probability (p) that a memory cell 26 has a certain resistance value and illustrating five categories for a first resulting count. The graph illustrates the probability (p) that a particular memory cell 26 has a certain resistance value after being written to a low resistive state at 150 and a high resistive state at 152. The resistance is plotted between zero and 100 percent of the resistance value samples. The resistance scale is divided into five regions, which are the five categories for a first count.

In category 154, the resistance value is very low and category 154 represents a shorted memory cell 26. Sense amplifier 34 controls the memory device 20 to immediately calibrate the read circuit 24 in a large calibration. After calibration, the selected memory cell 26 is sensed again. In the event a short category 154 is indicated n times (e.g., a defined number of times), sense amplifier 34 sets a flag that indicates the selected memory cell 26 is a short.

In category 156, the resistance value is larger than the resistance value of the shorted memory cell 26. However, the resistance value is not large enough to be categorized into no calibration region 158. Category 156 represents a small calibration or tune-up calibration region. Sense amplifier 34 controls the memory device 20 to immediately calibrate the read circuit 24 in a tune-up calibration. The memory device 20 uses the sense result and continues with the read operation using the sense result.

Category 158 represents resistance values that indicate no calibration is needed. Category 158 is a no calibration region including the low and high resistive states. Memory device 20 continues with the read operation using the sense result.

In category 160, the resistance value is smaller than the resistance value of an open memory cell 26. However, the resistance value is not small enough to be categorized in the no calibration region 158. Category 160 represents a small calibration region. Sense amplifier 34 controls the memory device 20 to immediately calibrate the read circuit 24 in a tune-up calibration. The memory device 20 continues with the read operation using the sense result.

In category 162, the resistance value is very high and category 162 represents an open memory cell 26. Sense amplifier 34 controls the memory device 20 to immediately calibrate the read circuit 24 in a large calibration. After calibration, the selected memory cell 26 is sensed again. In the event an open category 162 is indicated n times, sense amplifier 34 sets a flag that indicates the sensed resistance value is an open.

In this embodiment, threshold compare logic 106 includes threshold values for distinguishing between the five categories of resistance values sensed through memory cells 26. In one embodiment, the threshold values are calculated from a representative sample of memory cells 26 in memory device 20. Selected memory cells 26 are sensed in the low resistive state and the high resistive state. The sensed resistance values are divided into the five categories using predetermined criteria, such as standard deviations to determine the boundaries between the five categories. The calculated threshold values are stored in the threshold compare logic 106 for categorizing a first count into one of the five regions.

Figure 6:
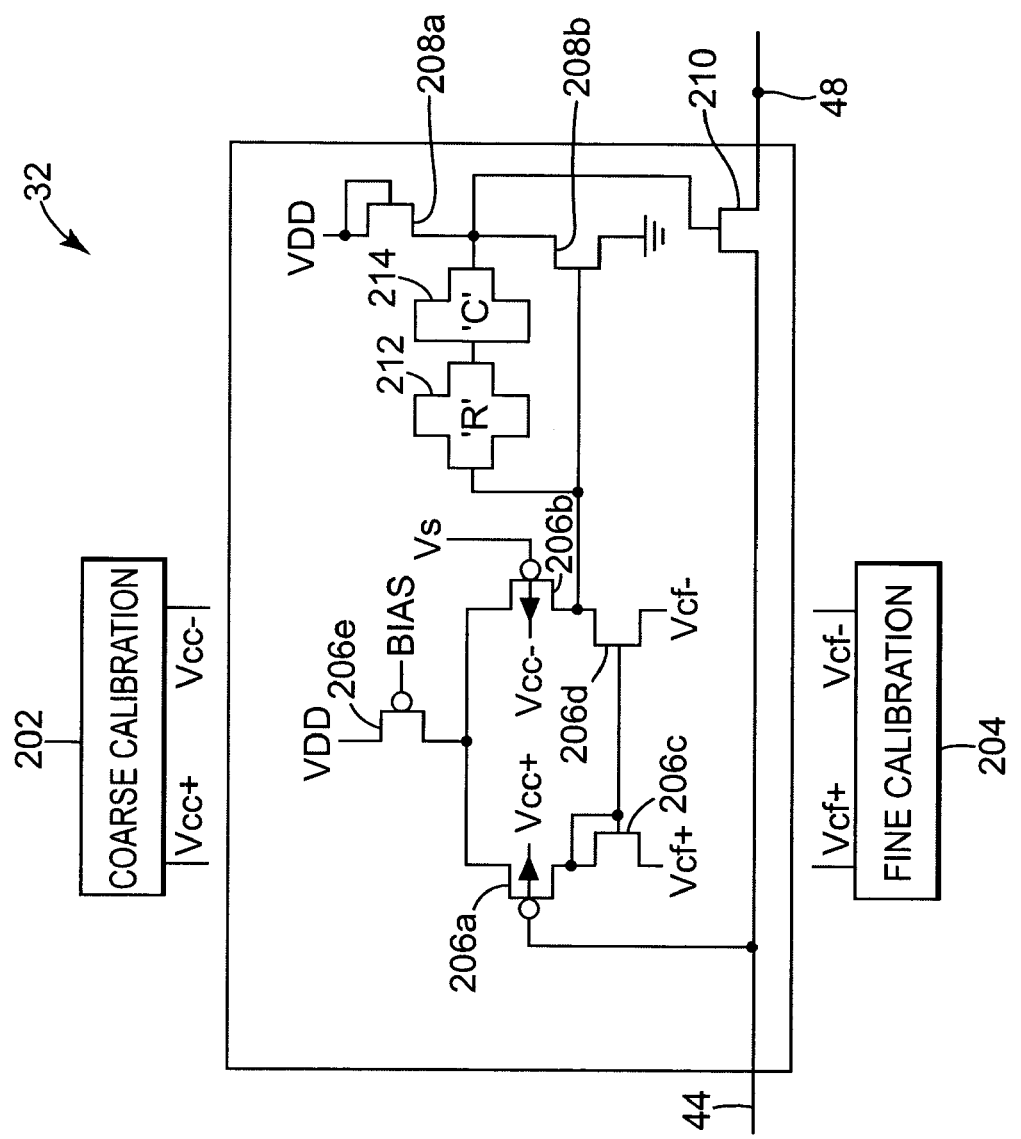
FIG. 6 is a diagram illustrating an exemplary embodiment of a direct injection charge amplifier having a digital offset calibration.

FIG. 6 is a diagram illustrating an exemplary embodiment of a direct injection charge amplifier 32. The charge amplifier 32 includes a PMOS differential amplifier, a coarse calibration circuit 202 and a fine calibration circuit 204. The PMOS differential amplifier includes first, second and third PMOS transistors 206a, 206b and 206e and first and second NMOS transistors 206c and 206d that provide a controlled current path. The PMOS transistors 206a and 206b are located in isolated n-type wells in a substrate that allows the back gate bias of the first and second PMOS transistors 206a and 206b to be controlled. Arrows extending through the gates of the PMOS transistors 206a and 206b schematically represent connections to the isolated wells. The substrate is common to NMOS transistors 206c and 206d.

The differential amplifier is followed by a second stage amplifier circuit including two transistors 208a and 208b for boosting the gain to control an output using a feedback loop. The feedback loop includes second stage transistors 208a and 208b followed by a current source transistor 210 and first PMOS transistor 206a. The second stage transistors 208a and 208b provide a control signal to the gate of current source transistor 210. A feedback signal is provided to first PMOS transistor 206a through current source transistor 210.

Closed loop stability may be an issue as a consequence of working with a high gain amplifier. Frequency compensation components include a resistor circuit 212 and a capacitor circuit 214 that control the stability of second stage transistors 208a and 208b. The resistor circuit 212 and capacitor circuit 214 reduce the high frequency gain of the second stage transistors 208a and 208b to thereby prevent the closed loop operational amplifier from being unstable.

The current source transistor 210 includes a gate coupled to second stage transistors 208a and 208b and capacitor circuit 214. A drain to source path through current source transistor 210 is electrically coupled to the gate of the first PMOS transistor 206a through charge amplifier output path 44. The drain to source path through current source transistor 210 is also electrically coupled to the node 48 of memory device 20.

In normal operation, a supply voltage VDD is provided to the third PMOS transistor 206e and the second stage transistor 208a. A BIAS voltage is applied to the gate of the third PMOS transistor 206e, and a sense voltage Vs is provided to the gate of the second PMOS transistor 206b. The charge amplifier 32 operates to maintain the sense voltage Vs on charge amplifier output path 44 due to the virtual short across the inputs of the differential amplifier between the gate of first PMOS transistor 206a and the gate of second PMOS transistor 206b. Charge amplifier output path 44 is electrically coupled to a selected memory cell 26.

Capacitor 38 (FIG. 4) is electrically coupled to node 48 and provides a sense current through current source transistor 210 to charge amplifier output path 44 and the selected memory cell 26. The charge amplifier 32 senses and controls the voltage on the charge amplifier output path 44 by adjusting the current through the current source transistor 210 and holding the current through the current source transistor 210 constant for a period of time. The sense current flows through the current source transistor 210 and the selected memory cell 26 to discharge the capacitor 38. The sense amplifier 34 senses and compares the voltage at node 48 to a reference voltage to obtain a sense result.

The coarse calibration circuit 202 performs a coarse offset correction. The coarse calibration circuit 202 performs the coarse offset correction by applying a back gate bias voltage Vcc+ and Vcc− to the isolated wells of the first and second PMOS transistors 206a and 206b. The level of the back gate bias voltage Vcc+ and Vcc− is set according to a first up/down counter value in the coarse calibration circuit 202. In one embodiment, the first up/down counter is an up/down ripple counter. The sensitivity of the offset voltage to back gate bias voltage variations can be rather large. Therefore, applying the back gate bias voltage Vcc+ and Vcc− is well suited for making coarse corrections to the offset voltage.

The fine calibration circuit 204 performs a fine offset correction. The fine offset correction is performed by adjusting impedances of the transistors 206a–206e in the differential amplifier. The amount of the impedance adjustment is determined by a second up/down counter value in the fine calibration circuit 204. In one embodiment, the second up/down counter is an up/down ripple counter.

Figure 7:
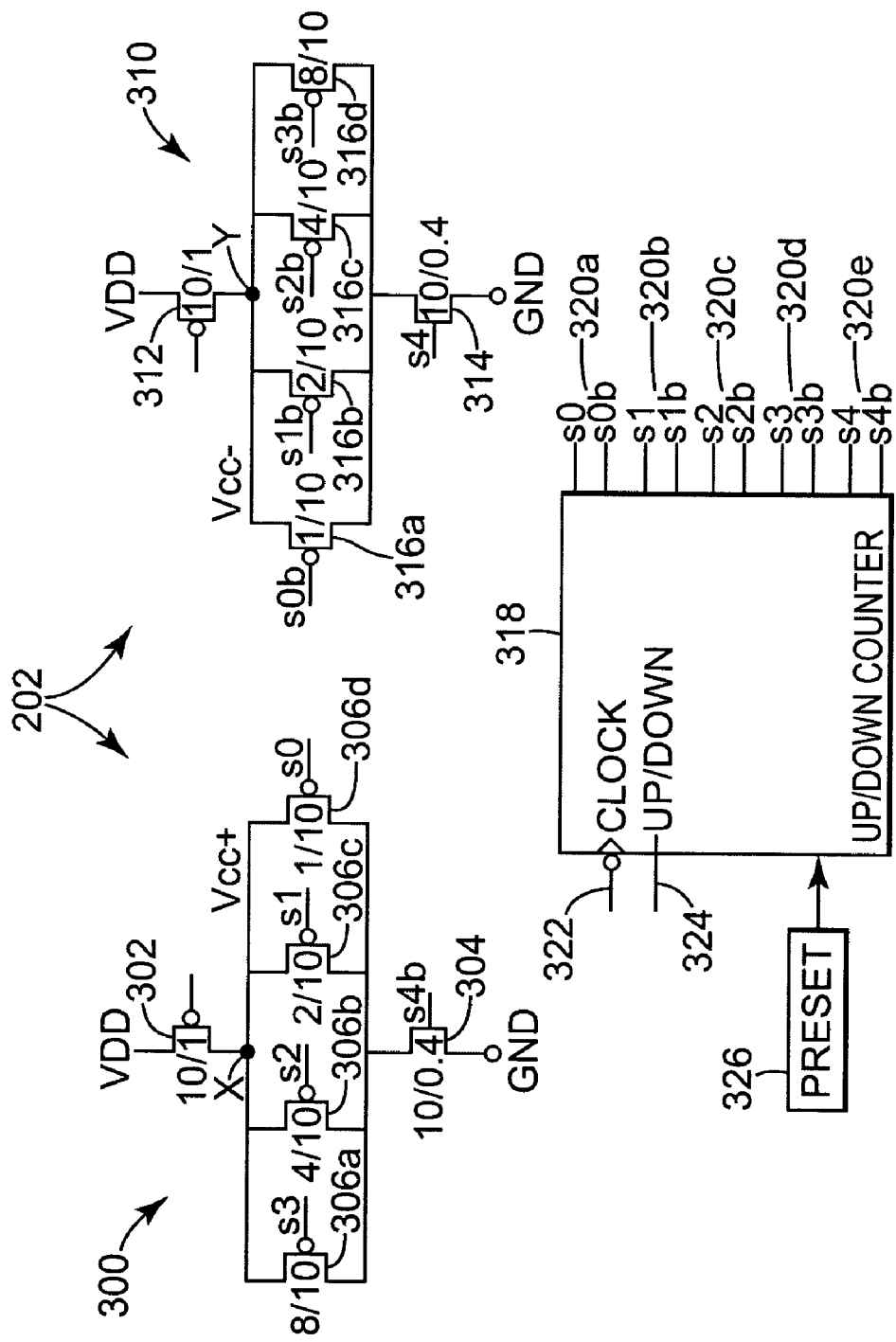
FIG. 7 is a diagram illustrating an exemplary embodiment of a coarse calibration circuit.

FIG. 7 is a diagram illustrating one embodiment of a coarse calibration circuit 202. The coarse calibration circuit 202 includes a pair of programmable voltage dividers 300 and 310 for developing the back gate bias voltage Vcc+ and Vcc− for the isolated wells of the PMOS transistors 206a and 206b. Each voltage divider 300 and 310 is connected between a source of operating potential (VDD) and a reference potential (GND).

The first voltage divider 300 is formed by upper and lower transistors 302 and 304, and four middle transistors 306a–306d having different drain to source path resistances. The numbers 1/10, 2/10, 4/10 and 8/10 represent transistor length and width sizes. The transistor size variations typically set the voltage divider ratios. Turning on different combinations of the middle transistors 306a–306d changes the voltage drop Vcc+ between a first node X and ground GND. The voltage drop Vcc+ is applied to the isolated well of the first PMOS transistor 206a.

The second voltage divider 310 also includes upper and lower transistors 312 and 314, and four middle transistors 316a–316d having different drain to source path resistances.

Turning on different combinations of the middle transistors 316a–316d changes the voltage drop Vcc− between a second node Y and ground GND. The voltage drop Vcc− is applied to the isolated well of the second PMOS transistor 206b.

The middle transistors 306a–306d and 316a–316d are turned on and off according to a first count from first up/down counter 318 and outputs 320a–320d. The first count determines the back gate bias voltage Vcc+ and Vcc− applied to the isolated wells of the first and second PMOS transistors 206a and 206b. The fifth output 320e of the first up/down counter 318 controls the lower transistors 304 and 314 so that either positive or negative correction can be performed. The coarse calibration circuit 202 controls the back gate bias voltage Vcc+ and Vcc− to as many as $2^5$ (or 32) different levels.

Figure 8:
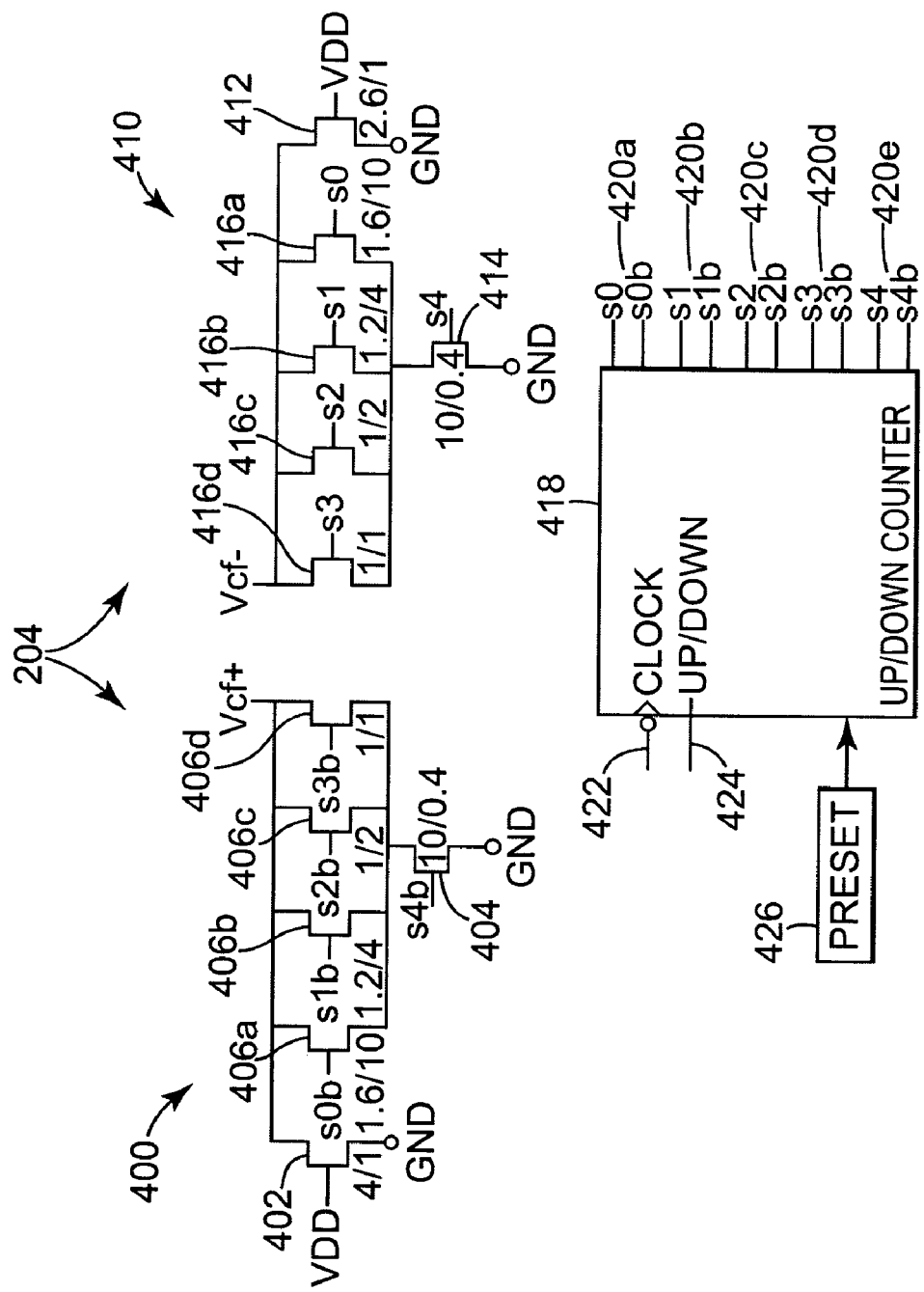
FIG. 8 is a diagram illustrating an exemplary embodiment of a fine calibration circuit.

FIG. 8 is a diagram illustrating one embodiment of a fine calibration (i.e., small calibration) circuit 204. The fine calibration circuit 204 includes first and second programmable circuits 400 and 410 which combine with the first and second NMOS transistors 206c and 206d, respectively, to form first and second current mirrors. The programmable circuit 400 is formed by a first pair of transistors 402 and 404, and four middle transistors 406a–406d having different drain to source path resistances. Turning on different combinations of the middle transistors 406a–406d changes the impedance levels in the first current mirror.

The second current mirror 410 is formed by a second pair of transistors 412 and 414, and four middle transistors 416a–416d having different drain to source path resistances. Turning on different combinations of the middle transistors 416a–416d changes the impedance level in the second current mirror.

During the normal mode of operation, the middle transistors 406a–406d and 416a–416d are turned on and off according to a second count from a second up/down counter 418 and outputs 420a–420d. The second count determines the impedance of the transistors 206a–206e in the differential amplifier. The fifth output 420e of the second up/down counter 418 controls the transistors 404 and 414 so that either positive or negative correction can be performed. The fine calibration circuit 204 can control the transistor impedance to as many as $2^5$ different levels.

A large calibration adjusts the count in first up/down counter 318 and second up/down counter 418. The counts are incremented or decremented by providing up/down signals at 324 and 424 and clock signals at 322 and 422. A small calibration or tune-up calibration adjusts the count in second up/down counter 418. The count is incremented or decremented by providing an up/down signal at 424 and a clock signal at 422. The clock signals provided at 322 and 422 can be a single clock pulse or multiple clock pulses. The up/down signals 324 and 424 and the clock signals 322 and 422 are provided from sense amplifier 34. In other embodiments, the up/down signals 324 and 424 and the clock signals 322 and 422 are provided by a separate circuit.

In the exemplary embodiment, the first up/down counter 318 is preset with a value from preset register 326. The second up/down counter 418 is preset with a value from preset register 426. The preset registers are set with specific values for initial calibration of the read circuit 24. In other embodiments, the specific values can be supplied through the I/O pads 56 of magnetic memory 20.

A large calibration is performed after first up/down counter 318 and second up/down counter 418 are preset for initial calibration from preset registers 326 and 426. A large calibration is performed in two stages. During the first stage, the count in first up/down counter 318 is adjusted to change the coarse calibration circuit 202. During the second stage, the count in second up/down counter 418 is adjusted to change the fine calibration circuit 204. A sense operation is performed on a selected memory cell 26 after each adjustment of the course calibration circuit 202 and the fine calibration circuit 204.

During the first stage of a large calibration, a sense operation is performed on selected memory cell 26 to obtain a calibration sense result. The calibration sense result is compared to a central calibration threshold value. Where the sense result is greater than the calibration threshold value and the previous sense result was also greater than the calibration threshold value, the first up/down counter 318 is decremented by one count and the first stage process is repeated. Where the sense result is less than the calibration threshold value and the previous sense result was also less than the calibration threshold value, the first up/down counter 318 is incremented by one count and the first stage process is repeated. In the event the sense result is equal to the calibration threshold value or the sense result went from greater than to less than or from less than to greater than the calibration threshold value from the previous to the current sense result, the first stage of a large calibration is complete.

During the second stage of a large calibration, a sense operation is performed on the selected memory cell 26 to obtain a calibration sense result. The sense result is compared to the central calibration threshold value. Where the sense result is greater than the calibration threshold value and the previous sense result was also greater than the calibration threshold value, the second up/down counter 418 is decremented by one count and the second stage process is repeated. Where the sense result is less than the calibration threshold value and the previous sense result was also less than the calibration threshold value, the second up/down counter 418 is incremented by one count and the second stage process is repeated. In the event the sense result is equal to the calibration threshold value or the sense result went from greater than to less than or from less than to greater than the calibration threshold value from the previous to the current sense result, the second stage of a large calibration is complete. After the second stage of a large calibration is complete, the large calibration is complete.

Figure 9:
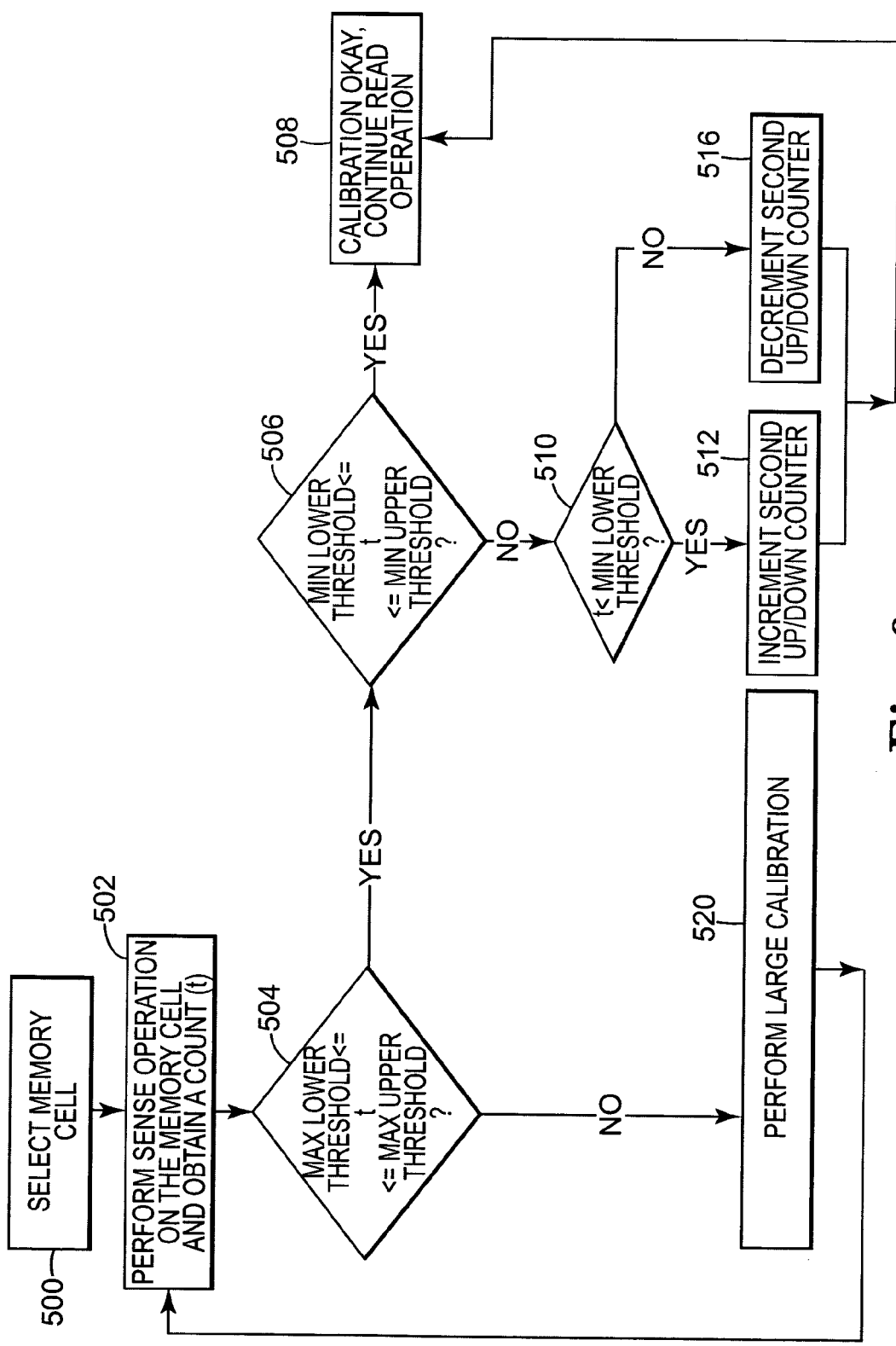
FIG. 9 is a flowchart illustrating an exemplary method for calibrating a read circuit.

FIG. 9 is a flowchart illustrating an exemplary read operation and calibration of read circuit 24. At 500, read circuit 24 selects a memory cell 26 intersected by a selected word line 40a–40c and a selected bit line 42a–42c. The selected word line 40a–40c is coupled to ground and the selected bit line 42a–42c is coupled to charge amplifier 32.

At 502, the read circuit 24 performs a sense operation on the selected memory cell 26 and obtains a sense result. The sense result is obtained by measuring the amount of time for the voltage on capacitor 38 to decay to a reference voltage Vref. The sense result is a count that corresponds to the time to decay to the reference voltage Vref.

The read circuit 24 determines if the sense result is between a maximum upper threshold value and a maximum lower threshold value at 504. If the sense result is less than or equal to the maximum upper threshold value and greater than or equal to the maximum lower threshold value, the read circuit 24 determines if the sense result is between a minimum upper threshold value and a minimum lower threshold value at 506. If the sense result is less than or equal to the minimum upper threshold value and greater than or equal to the minimum lower threshold value, the read circuit does not require calibration and a read operation continues at 508.

In the event the sense result is outside the minimum lower and upper threshold values, calibration of the read circuit is required. At 510, if the sense result is less than the minimum lower threshold value, the second up/down counter 418 receives a clock pulse 422 and a signal 424 to increment the second up/down counter 418 at 512. If the sense result is greater than the minimum upper threshold value, the second up/down counter 418 receives a clock pulse 422 and a signal 424 to decrement the up/down counter at 516. The read operation continues using the sense result at 508.

In the event the sense result is outside the maximum lower and upper threshold values, a large calibration of the read circuit 24 is required. At 520, the first 318 and second 418 up/down counters receive clock pulses 322 and 422 and signals 324 and 424 to increment and decrement the 318 and 418 up/down counters in a large calibration. Another sense operation is performed at 502 and the method repeats until the sense result is within the maximum lower and upper threshold values or the memory cell 26 is flagged as an open or a short.

What is claimed is:

1. A resistive cross point memory, comprising:
   an array of memory cells; and
   a read circuit comprising a charge amplifier and configured to sense a resistance through a memory cell in the array of memory cells to obtain a sense result and adjust the read circuit based on the sensed result, where the road circuit comprises an up/down counter that provides a calibration value to the charge amplifier and the read circuit provides calibration for adjusting a coarse calibration value and a fine calibration value.

2. The resistive cross point memory of claim 1, where the up/down counter is configured to provide the coarse calibration value in a complete calibration of the read circuit.

3. The resistive cross point memory of claim 1, where the up/down counter is configured to provide the fine calibration value in a complete calibration and in a tune-up calibration of the read circuit.

4. The resistive cross point memory of claim 1, where the read circuit is configured to provide a tune-up calibration that provides an adjustment to the fine calibration value.

5. The resistive cross point memory of claim 1, where the up/down counter receives a single clock pulse to adjust the fine calibration value in a tune-up calibration.

6. The resistive cross point memory of claim 1, where the up/down counter is an up/down ripple counter.

7. The resistive cross point memory of claim 1, where the read circuit comprises an integrator for obtaining a sense result.

8. The resistive cross point memory of claim 1, where the read circuit comprises:
   a sense amplifier;
   a capacitor electrically coupled to the sense amplifier and the charge amplifier; and
   a switch electrically coupled to the sense amplifier, the charge amplifier, and the capacitor.

9. The resistive cross point memory of claim 1, where the resistive cross point memory is a magnetic random access memory.

10. A resistive cross point memory, comprising:
    an array of memory cells; and
    a read circuit configured to sense a resistance through a memory cell in the array of memory cells to obtain a sense result and adjust the read circuit based on the sensed result, where the read circuit comprises an up/down counter that provides a calibration value to the read circuit, where the up/down counter receives a clock pulse to adjust a fine calibration value in a tune-up calibration.

11. A magnetic memory comprising:
    a memory cell;
    a charge amplifier configured to provide a sense voltage to the memory cell and integrate a sense current through the memory cell;
    a sense amplifier configured to sense integration time and provide a sense result and including a counter that provides the sense result as a sense count; and
    an up/down counter configured to provide a calibration value to the charge amplifier.

12. The magnetic memory of claim 11, where the up/down counter is configured to provide to calibration value to adjust back gate bias voltages on transistor wells in the charge amplifier.

13. The magnetic memory of claim 11, where the up/down counter is configured to provide the calibration value to adjust impedances in the charge amplifier.

14. The magnetic memory of claim 11, where the sense amplifier comprises threshold valves that are compared to the sense result to determine charge amplifier calibration needs, where the up/down counter receives a clock signal to change the calibration value in the event the sense result exceeds one of the threshold values.

15. The magnetic memory of claim 11, where the charge amplifier comprises:
    a plurality of transistors that provide a controlled current path, with at least two of the transistors situated in isolated wells; and
    a calibration circuit responsive to a value in the up/down counter to provide at least one of the following: a back gate bias voltage to at least one isolated well and adjusting the impedance of the transistors providing to controlled current path, where the level of the back gate bias voltage and the amount of impedance adjustment is determined by the value of the up/down counter.

16. A magnetic memory, comprising:
    means for sensing a resistance through a memory cell;
    means for comparing the sensed resistance to a threshold value;
    means for modifying a count in an up/down counter that provides a calibration value to calibrate a read circuit to improve reliability of read operations
    means for coarse calibration of the read circuit; and
    means for fine calibration of the read circuit.

17. The magnetic memory of claim 16, further comprising:
    mean for performing an initial calibration of the read circuit;
    means for providing a complete calibration of the read circuit; and
    means for providing a tune-up calibration of the read circuit.

18. A method of calibrating a magnetic memory, comprising:
    sensing a resistance through a memory cell to obtain a sense result;
    comparing the sense result to threshold values to determine complete calibration regions, tune-up calibration regions, and no calibration regions; and
    clocking an up/down counter to adjust a calibration value.

19. The method of claim 18, where comparing the sense result comprises comparing the sense result to threshold values that are predetermined threshold values around each resistive state of the memory cell.

20. The method of claim 18, where sensing a resistance comprises obtaining a sense count that represents an integration time for a voltage on a capacitor to reach a reference voltage.

21. The method of claim 18, where sensing a resistance comprises:
applying a voltage across a selected bit line and a selected word line crossing a selected memory cell; and
applying an array voltage to unselected word lines and bit lines to reduce parasitic currents.

22. A method for calibrating a read circuit in a resistive cross point memory comprising:
providing an up/down counter;
selecting a resistive cross point memory cell;
sensing resistance through the selected resistive cross point memory cell in a sense operation;
obtaining a sense result that represents an integration time for the sense operation;
comparing the sense result to a threshold value; and
applying a clock signal to the up/down counter to adjust fine and coarse calibration values in the event the sense result exceeds the threshold value.

23. The method of claim 22, where the resistive cross point memory cell is a magnetic random access memory cell.

24. A method comprising:
calibrating a read circuit in a magnetic memory to improve read operations of the read circuit by:
performing a first sense operation and obtaining a first sense result;
comparing the first sense result to first and second upper threshold values and to first and second lower threshold values, where the first upper threshold value is greater than the second upper threshold value and the first lower threshold value is less than the second lower threshold value;
providing a clock pulse to an up/down counter if the first sense result is one of the following: greater than the second upper threshold value and less than the second lower threshold value;
performing a second sense operation and obtaining a second sense result if the first sense result is one of the following: greater than the first upper threshold value and less than the first lower threshold value; and
comparing the second sense result to the first and second upper threshold values and to the first and second lower threshold values.

25. The method of claim 24, where the magnetic memory is a magnetic random access memory.

* * * * *